United States Patent
Link et al.

(10) Patent No.: US 9,653,242 B2
(45) Date of Patent: May 16, 2017

(54) ACTUATOR OF A SAFETY SWITCH AND SAFETY SWITCH HAVING SUCH AN ACTUATOR

(71) Applicant: Euchner GmbH + Co. KG, Leinfelden-Echterdingen (DE)

(72) Inventors: Walter Link, Rutesheim (DE); Johannes Häussler, Stuttgart (DE); Bernd Hermann, Rottenburg (DE)

(73) Assignee: Euchner GmbH + Co. KG, Leinfelden-Echterdingen (DE)

( * ) Notice: Subject to any disclaimer, the term of this patent is extended or adjusted under 35 U.S.C. 154(b) by 0 days.

(21) Appl. No.: 14/907,583

(22) PCT Filed: May 28, 2014

(86) PCT No.: PCT/EP2014/001432
§ 371 (c)(1),
(2) Date: Jan. 26, 2016

(87) PCT Pub. No.: WO2015/028106
PCT Pub. Date: Mar. 5, 2015

(65) Prior Publication Data
US 2016/0260565 A1   Sep. 8, 2016

(30) Foreign Application Priority Data

Aug. 30, 2013 (DE) .................... 10 2013 014 456

(51) Int. Cl.
*H03K 17/97*   (2006.01)
*H01H 50/36*   (2006.01)
(Continued)

(52) U.S. Cl.
CPC .......... *H01H 50/36* (2013.01); *H01H 27/007* (2013.01); *H01H 50/44* (2013.01);
(Continued)

(58) Field of Classification Search
CPC ...... H03K 2017/9706; H03K 17/952–17/9547
See application file for complete search history.

(56) References Cited

U.S. PATENT DOCUMENTS 6,409,083 B1 *   6/2002   Link ................... H03K 17/945
235/449

FOREIGN PATENT DOCUMENTS

DE   102011121235 A1   6/2013
EP   0814490 A2   12/1997
(Continued)

*Primary Examiner* — Ramon M Barrera
(74) *Attorney, Agent, or Firm* — Michael Soderman

(57) ABSTRACT

The invention relates to an actuator (1) of a safety switch (10) for detecting and locking a specifiable state of an apparatus (2), in particular for detecting and locking the closed state of a safety device of a machine (4) or the like, wherein the actuator (1) has an inductor (36) for a contact-free signal exchange with a reading inductor (38) of a switch element (16) of the safety switch (10), and wherein the actuator (1) has a locking flank (50) on which a lock element (24) of the switch element (16) can be brought into locking contact and the actuator (1) can therefore be locked on the switch element (16), characterized in that the inductor (36) has at least one winding extending around the locking flank (50) or around a recess or hole in the actuator (1) forming the locking flank (50) so that the at least one winding extends around the lock element (24) or around an extension of the lock element (24) in the state in which the actuator (1) is locked to the switch element (16), as well as a safety switch having such an actuator.

5 Claims, 6 Drawing Sheets

(51) Int. Cl.
*H01H 27/00* (2006.01)
*H01H 50/44* (2006.01)
*H03K 17/95* (2006.01)

(52) U.S. Cl.
CPC ........... *H03K 17/97* (2013.01); *H03K 17/952* (2013.01); *H03K 2017/9527* (2013.01); *H03K 2017/9706* (2013.01)

(56) References Cited

FOREIGN PATENT DOCUMENTS

| | | | | |
|---|---|---|---|---|
| GB | 1066941 A | * | 4/1967 | ............. B23Q 15/00 |
| WO | 9843351 A1 | | 10/1998 | |

* cited by examiner

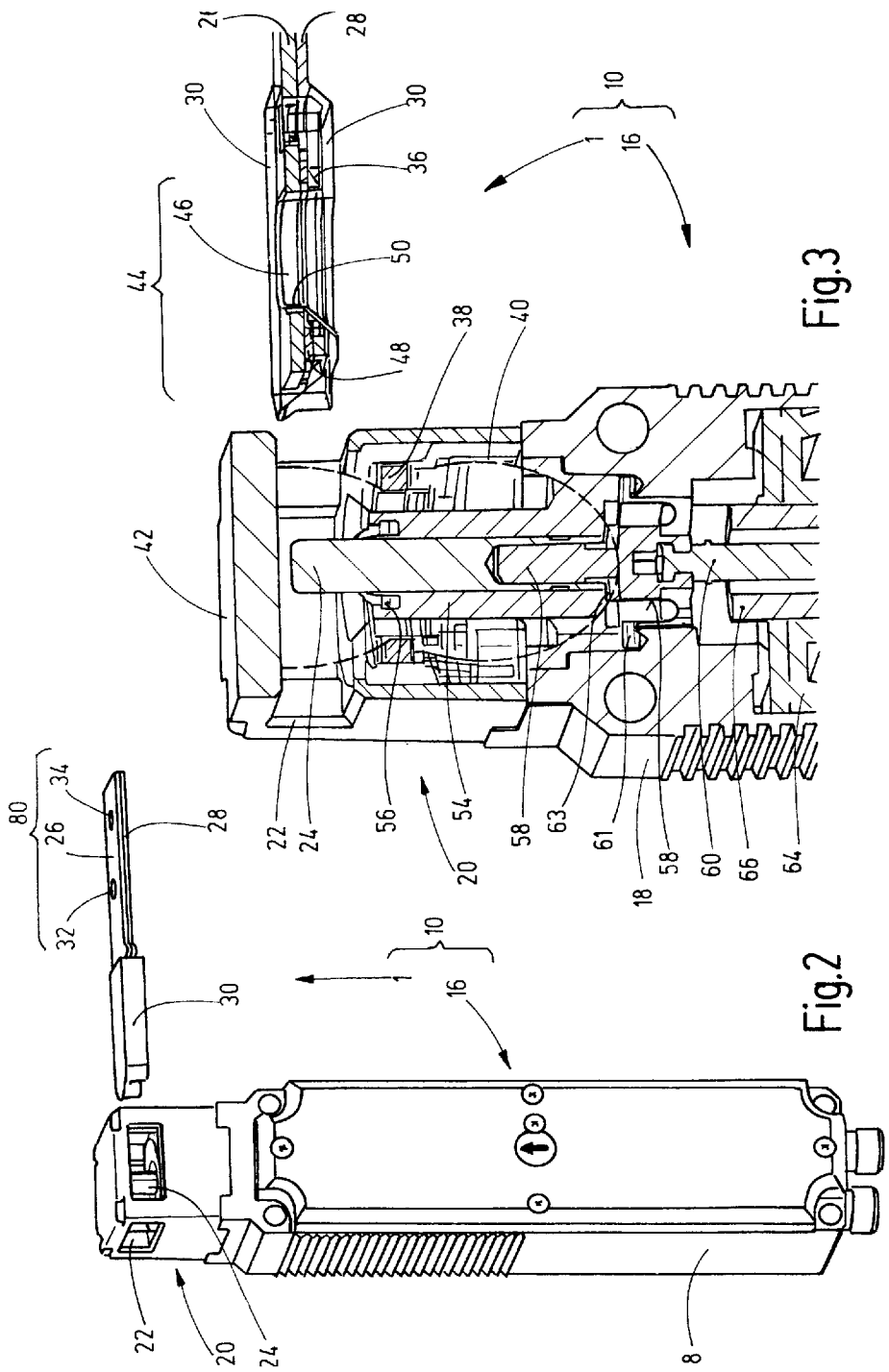

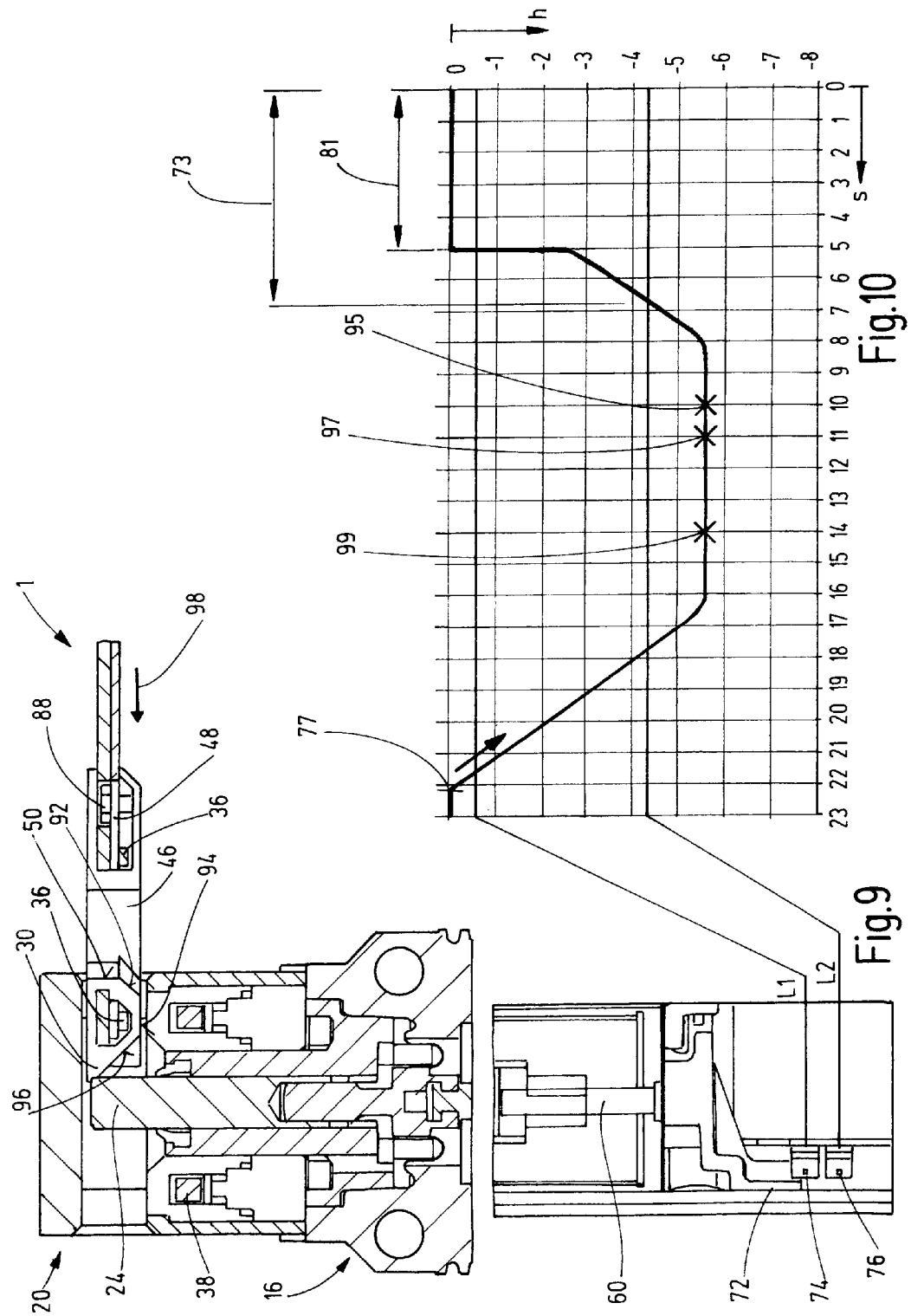

ACTUATOR OF A SAFETY SWITCH AND SAFETY SWITCH HAVING SUCH AN ACTUATOR

CROSS REFERENCE TO RELATED APPLICATIONS

This application is the U.S. national stage of International Application No. PCT/EP2014/001432, filed on May 28, 2014, and claims the benefit thereof. The international application claims the benefits of German Application No. DE 102013014456.6 filed on Aug. 30, 2013; all applications are incorporated by reference herein in their entirety.

BACKGROUND

The instant invention relates to an actuator of a safety switch for detecting and locking a specifiable state of an apparatus, in particular for detecting and locking the closed state of a safety device of a machine or the like, as well as a safety switch with an actuator of that type.

Safety switches are used, as an example, for monitoring the state of a safety device of a machine, for instance for monitoring the closed state of a protective door of a protective room for a machine tool or an industrial robot. The safety switch can provide an enabling signal for the operation of the machine in the closed state of the safety device. The safety switch provides a force-actuated interruption when the safety device is opened, for instance via an electrical contact pair that is to be actuated with a positive lock or via an electronic circuit element, an electrical circuit or multiple electrical circuits. The enabling signal is then no longer provided. The corresponding machine can then be put into a safe operating state, for instance shut down, or the machine can be prevented from being switched on.

It is necessary in a few applications for the closed state of the safety device to be capable of being locked in a releasable way, for instance when the safety device is to be prevented from being opened in an operating state of the machine; the lock is only released after a standstill of the machine, and the safety device can be opened.

In the case of safety switches with mechanical actuators, locking or blocking of that type is carried out by locking the mechanical actuator in the state introduced into a switch head of the safety switch, as known from DE 43 28 297 C1.

A safety switch is known from WO 98/43351 A1 with an actuator that has an inductor for a contact-free signal exchange with the safety switch, in particular with a reading head of the safety switch.

SUMMARY

The invention relates to an actuator (1) of a safety switch (10) for detecting and locking a specifiable state of an apparatus (2), in particular for detecting and locking the closed state of a safety device of a machine (4) or the like, wherein the actuator (1) has an inductor (36) for a contact-free signal exchange with a reading inductor (38) of a switch element (16) of the safety switch (10), and wherein the actuator (1) has a locking flank (50) on which a lock element (24) of the switch element (16) can be brought into locking contact and the actuator (1) can therefore be locked on the switch element (16), characterized in that the inductor (36) has at least one winding extending around the locking flank (50) or around a recess or hole in the actuator (1) forming the locking flank (50) so that the at least one winding extends around the lock element (24) or around an extension of the lock element (24) in the state in which the actuator (1) is locked to the switch element (16), as well as a safety switch having such an actuator.

DETAILED DESCRIPTION

The instant invention is based on the problem of providing an actuator for a safety switch and an accompanying safety switch that have further improved usage characteristics. In one type of embodiment, the operating safety of the safety switch, which is already quite high, is to be further increased. In particular, a situation is to be reliably ruled out in which the safety switch signals the presence or locking of the actuator and therefore, as an example, the closed and locked state of a safety device of a machine, for instance because of the failure of electronic components or because of manipulation attempts, although the actuator is not properly positioned or locked on the safety switch. The actuator and/or the locking mechanism should have a design that is as compact as possible here.

The problem is solved by the actuator specified in claim 1 and by the safety switch specified in the other independent claim. Special embodiment types of the invention are specified in the dependent claims and the following description.

In one type of embodiment, the invention relates to an actuator of a safety switch for detecting and locking a specifiable state of an apparatus, in particular for detecting and locking the closed state of a safety device of a machine or the like. The actuator has inductance for a contact-free signal exchange with a reading inductor of a safety switch, which can be arranged in a reading head of the safety switch, for instance. A tuning capacitor and/or a transponder chip that can also make an unambiguous identification of the actuator possible can be connected to the inductor. The reading inductor can also be designed to be a reading/writing inductor and/or an energy supply inductor for the electrical energy supply of the actuator.

The actuator has a locking flank on which a lock element of the safety switch can be brought into locking contact, thereby locking the actuator on the safety switch. The inductor has at least one winding extending around the locking flank or around a recess or hole in the actuator forming the locking flank to the effect that the at least one winding extends around the lock element or around an extension of the lock element in the state in which the actuator is locked to the safety switch. The inductor can be formed, in particular, by a coil having several windings; the coil can extend around the locking flank with several or all of the windings. The recess or hole in the actuator can constitute an elongated hole, for example. The locking flank can be formed by the edge of a recess, hole or groove, for instance. In particular, the locking flank can be arranged in the center of the winding surrounding it. In the locked state of the actuator, the lock element can reach through the winding or approach the winding, preferably in the center, in such a way that the winding of the inductor extends in any case around a conceptual extension of the lock element and, preferably, that a reliable lock is ensured by a positive interlock of the lock element with the locking flank and, in the process, reliable signal transmission is ensured.

In one type of embodiment, a recess or hole forming the locking flank is centrally arranged within the minimum of one winding of the inductor. The recess or hole can be basically cylindrical with sufficient size for the entry of the lock element. The recess or hole can have an oblong or rectangular contour, so the actuator can still be moved in the switch element of the safety switch, in particular in a switch head, even after the entry of the lock element into the recess or hole, and the actuator can nevertheless be reliably locked.

In one type of embodiment, the actuator has a predetermined breaking point that is arranged between a fastener section and a locking-flank section of the actuator having a locking flank. When the actuator is locked on the safety switch, the locking-flank section can be separated from the fastener section at the predetermined breaking point when excessive tensile force arises. The predetermined breaking point can, in particular, be formed by local material thinning of the section of the actuator constituting the predetermined breaking point. The tongue-shaped actuator, as an example, can also have a predetermined breaking point on both sides of the recess or hole forming the locking flank. The force required for the separation of the locking-flank section at the predetermined breaking point is preferably chosen in such a way that mechanical damage to the safety switch, for instance to the lock element, will not occur because of that. Only the actuator will be damaged because of that and will have to be replaced due to the excess tensile force, whereas the safety switch will remain undamaged and can still be used.

In one type of embodiment, a first portion of electrical components of the actuator required for the signal exchange with the safety switch are connected to the locking-flank section. A second portion of the components of the actuator required for the signal exchange with the safety switch are connected to the fastener section. When excess tensile force arises, an electrical connection of the two portions of the electrical components required for the signal exchange can be separated; the signal exchange is interrupted because of that. A fracture of the actuator can thereby be electrically detected in a reliable way; in particular, the safety switch immediately registers a dangerous operating state that is associated with that.

The connection of electrical components to the locking-flank section, on the one hand, and to the fastener section, on the other hand, can take place via corresponding circuit boards or circuit-board sections that fracture on their part when excess tensile force arises and interrupt the electrical connection because of that, preferably before a separation of the locking-flank section from the fastener section. The inductor of the actuator can be connected to the locking-flank section, for instance; in particular, the lock element of the safety switch can engage in the winding of the inductor in the locked state, so the connection line of the inductor is interrupted and/or the inductor is opened on the whole when excess tensile force arises.

In one type of embodiment, the predetermined breaking point of the actuator can be stretched, including plastic stretching, before the separation of the locking-flank section from the fastener section. The electrical connection of the two portions of the components required for the signal exchange with the safety switch can already be separated here, as long as the locking-flank section has not yet been separated from the fastener section. This can be accomplished, as an example, by bringing about the interruption of the electrical connection via the fracture of a brittle circuit board, for instance, by pulling out a connection line or by shearing out an electrical component from the circuit board, while the predetermined breaking point has a relatively large area with plastic elongation as a result of the corresponding ductile characteristics of the preferably metal material of the actuator. This brings about a situation in which the block is still active; in particular, the actuator is still locked on the safety switch, but the control unit can already detect a malfunction due to the interruption of the electrical connection.

In one type of embodiment, a circuit board on which at least one portion of the electrical components required for the signal exchange with the safety switch are located has an armature section that is coupled in a movable fashion to the fastener section of the actuator via a positive interlock. As an example, an armature section of this type can be inserted into an opening in the fastener section that has, for its part, an undercut that can be filled out by the armature section. As a preference, the circuit board will fracture at the transition section to the armature section before the separation of the locking-flank section from the fastener section. The electrical connection is interrupted in the process.

In one type of embodiment, the actuator has at least two sheet metal parts that are on top of one another and preferably in the form of strips; one of the sheet metal parts is positioned further back with respect to the sheet metal part on top of it and its axial end forming the locking-flank section. The inductor, for instance a circuit board with a coil on it, can be arranged on the other sheet metal part that is on top in the section that became free because of the part that was positioned further back. The sheet metal parts are, aside from the positioning further back, congruent, at least in sections, and can be manufactured in the form of stamped parts as an example. The contour of the actuator, in particular, including a possible predetermined breaking point, can be provided in a simple and reproducible way because of that.

The invention also relates to an actuator of a safety switch for detecting and locking a specifiable state of an apparatus, in particular for detecting and locking the closed state of a safety device of a machine or the like. The safety switch has a reading inductor for a contact-free signal exchange with an actuator and a lock unit that can be moved in a controlled fashion along its longitudinal axis and brought into a positive interlock with the actuator. The lock unit can have an armature section, as an example, and can moved in an electromagnetic fashion in its longitudinal direction in the safety switch housing.

The actuator has a design as described above, and the reading inductor has at least one winding extending around the lock unit. An especially good and reliable electromagnetic coupling is thereby ensured with the inductor of the actuator. The inductors of the actuator and of the reading head, especially the associated windings or coils, can essentially be concentric or even congruent in a state in which the actuator is locked on the safety switch. The reading inductor can have a circular contour, as an example, and the center of the reading inductor can essentially coincide with the center of the inductor of the actuator having an oblong contour.

In one type of embodiment, a socket element extending around the lock element is made of a metallic, in particular ferromagnetic, material. The socket element can, in particular, be arranged between the inner lock unit that is essentially centrally arranged in a switch housing of a switch element of the safety switch and the outer reading coil. An advantageous formation of the electromagnetic field induced by the reading inductor can be achieved by the socket element; in particular, the signal coupling with the actuator can be improved in the desired response range.

In one type of embodiment, the safety switch has a switch head that has at least one opening for the insertion of the actuator. The reading head is designed in such a way that a signal exchange between the reading inductor and the inductor of the actuator is only possible when the actuator is completely inserted into the reading head. A situation can be prevented, for instance, in which an actuator that is only laid externally on the switch head is still in the response range of the reading inductor and the safety switch therefore wrongly signals that the actuator has been inserted into the switch head. To achieve this, several measures can be individually taken or taken in combination with one another; as an example, a hood forming the opening for the insertion of the actuator into the reading head can be made of a metallic, in particular ferromagnetic, material. Alternatively or as a supplement, compensation coils can be arranged in the reading head that reduce undesired side lobes of the electromagnetic field generated by the reading inductor or limit the main lobe and therefore also limit the response range of the reading inductor to the range within the switch head. A safety switch can be realized in which the actuator can be inserted into the switch head from different directions, in particular from four directions, that are at an angle of 90° with respect to one another, via a central arrangement of the lock unit in the switch head and/or a central arrangement of the reading inductor.

Further advantages, features and details of the invention follow from the dependent claims and the following description in which several examples are described in detail with reference to the drawings. The features mentioned in the claims and in the description can be important for the invention on an individual basis in and of themselves or in any arbitrary combination here.

BRIEF DESCRIPTION OF THE DRAWINGS

FIG. 2 shows a view in perspective of a safety switch as per the invention, FIG. 3 shows, in an enlarged view, a section of FIG. 2 in the area of the switch head and the actuator, FIG. 9 shows the upper and lower areas of the switch element with an actuator that has not yet been completely inserted into the reading head, and FIG. 10 shows the associated switch path diagram.

DETAILED DESCRIPTION OF THE PREFERRED EMBODIMENT

Figure 1:
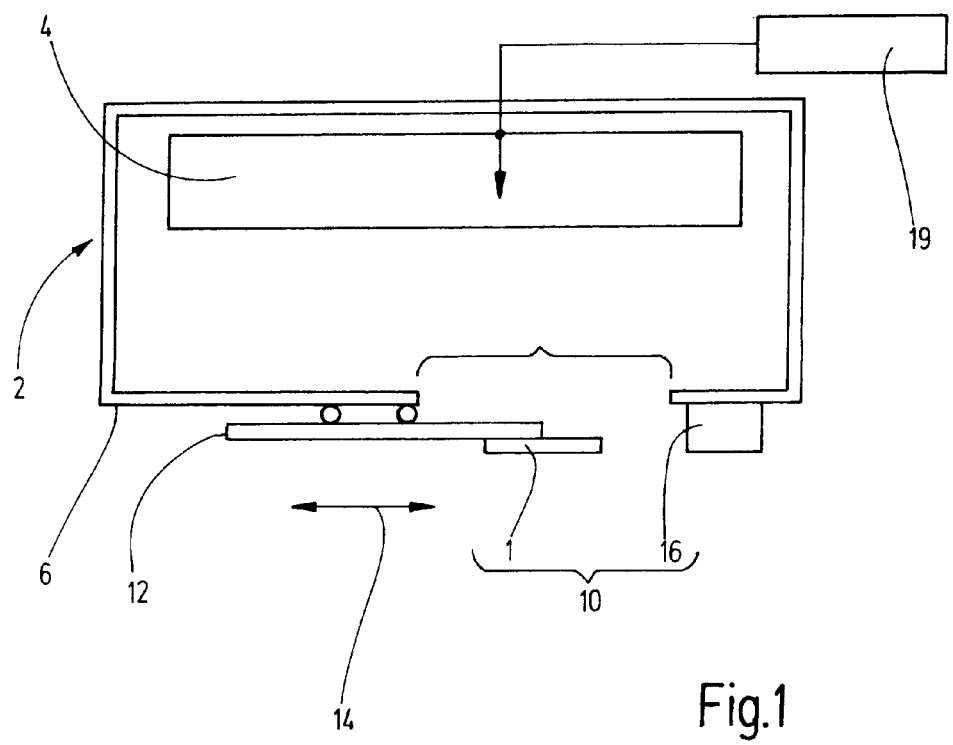
FIG. 1 shows a schematic top view of an overall arrangement of an apparatus with a safety switch.

FIG. 1 shows a schematic top view of an overall arrangement of an apparatus 2, a safety device of a machine 4 in the example, that could involve, as an example, a machine tool or a welding robot. The apparatus 2 protects the operating personnel from danger from the machine 4 that is in operation, for instance. The apparatus 2 has a first part 6, preferably fixed, for instance a frame of the apparatus 2. The first part 6 has an opening 8 that can be closed by a second part 12 of the apparatus 4, for instance by a protective door that can be moved with respect to the first part 6 in accordance with the double arrow 14. A safety switch 10 that is comprised of a switch element 16 that is preferably arranged on the fixed first part 6 and an actuator 1 that is preferably arranged on the movable second part 12 is attached to the apparatus 2. The safety switch 10 is connected to a control unit 19 that controls the machine 4.

FIG. 2 shows a view in perspective of a safety switch 10 as per the invention with the switch element 16 and the actuator 1. The switch element 16 has a switch housing 18 in which the switching mechanism and the switching electronics are housed. At its upper end, arranged on the switch housing 18, is an essentially cube-shaped switch head 20 that is attached in a releasable fashion on the switch housing 18 and that has one entry opening 22 each at a total of four side areas for the insertion of the actuator 1 into the switch head 20. A lock element 24 is arranged in the switch head 20 and the switch housing 18, preferably centrally in the switch head 20, so as to be movable in a controllable way in the direction of its longitudinal axis, that would lock an actuator 1 on the switch element 16 introduced into the switch head 20 in the position shown in FIG. 2, which is extended out of the switch housing 18.

The actuator 1 has two strip-shaped sheet metal parts 26, 28 arranged on top of one another that are bordered by a casing 30, preferably made of plastic, at their end that is turned towards the switch head 20. At their opposite end, the two sheet metal parts 26, 28 form a fastener section 80 with two fastener openings 32, 34 via which the actuator 1 can be fixed in place on the second part 12 of the apparatus 2.

Figure 4:
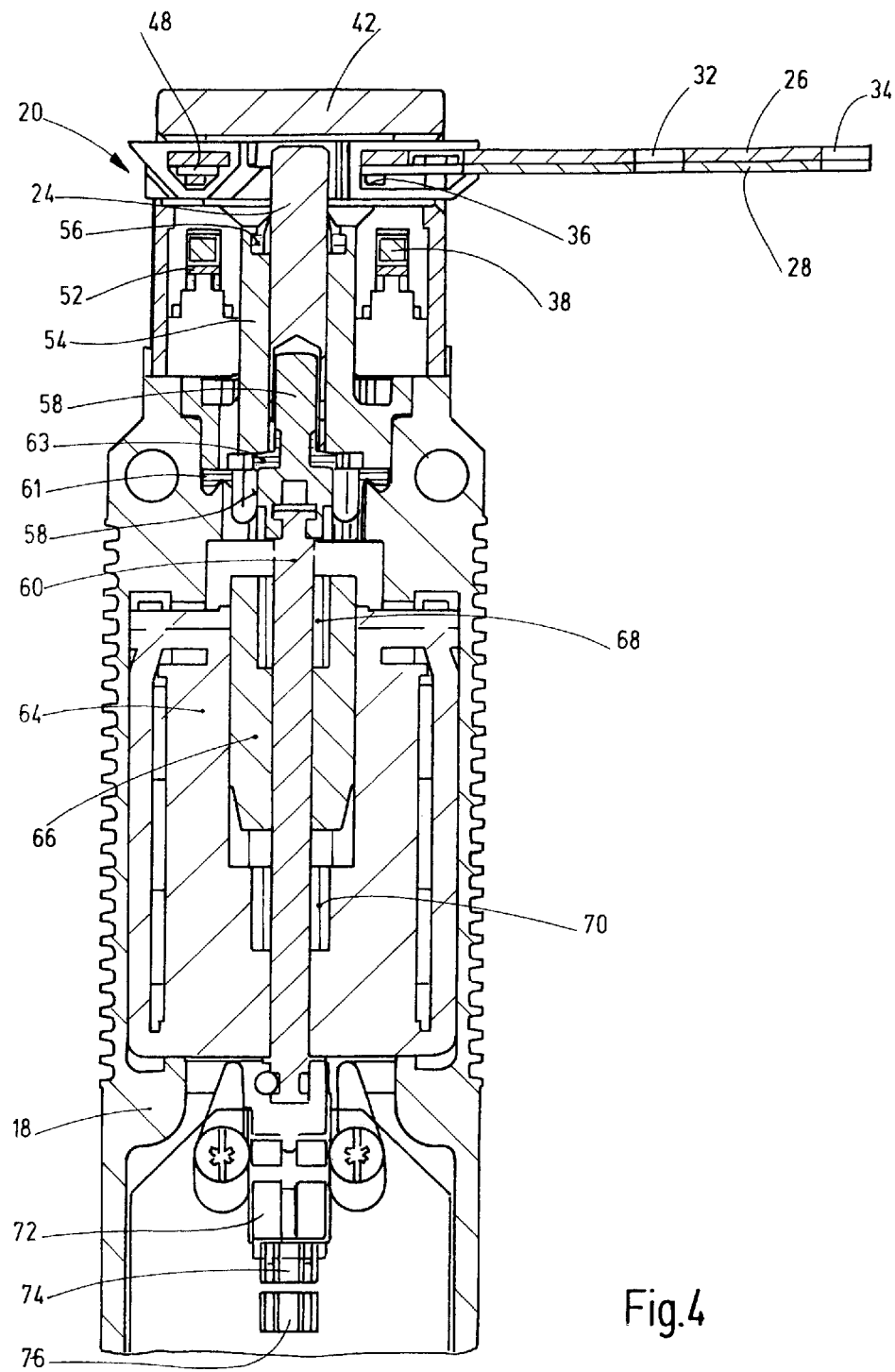
FIG. 4 shows a view of a section through the upper part of the switch element with an inserted actuator.

FIG. 3 shows, in an enlarged view, a section of FIG. 2 in the area of the switch head 20 and the actuator 1, which are each shown in a cut section. FIG. 4 shows a view of a section through the upper part of the switch element 16 with an actuator 1 that is inserted into the switch head 20 and locked in place there.

The actuator 1 has an inductor 36 that constitutes a coil having multiple windings in the example. The inductor 36 can, in the state shown in FIG. 4, exchange signals in a contact-free fashion with a reading inductor 38 that is arranged in the switch head 20. The response range 40 of the reading coil 38 is shown with a dashed line in FIG. 3. A signal exchange with the reading coil 38 is possible when the inductor 36 of the actuator 1 is located in the response range 40, and the safety switch 10 can signal that the actuator 1 has been completely inserted into the switch head 20 and the apparatus 2 is therefore closed. In addition to the inductor 36, the actuator 1 can have, as examples, a tuning capacitor, a transponder chip or a radio frequency identification tag (RF-ID tag). Because of the use of a metallic or even ferromagnetic material for the hood 42 or a suitable shielding of the switch head 20, the response range 40 is limited to a spatial area that only extends in the switch head 20 or the switch housing 18.

The limitation of the response range 40 prevents a situation, for instance, in which an incorrectly mounted actuator 1 is merely on top of the switch head 20, but has not been inserted into the switch head 20 and can therefore also not be locked in place there, leads to an erroneous signal of the safety switch 10. Furthermore, a situation is ruled out because of that in which, for example, a transponder of the actuator 1 is already detected when the actuator 1 has not yet or has not yet fully been inserted into the switch head 20 and an inaccurate signal, for instance "Protective door is closed and ready to be blocked", is wrongly issued by the safety switch 10 because of that.

Furthermore, a situation is reliably prevented in which a defect in an electronic component of the safety switch 10, which can lead to excessive sensitivity of the reading inductor 38, as an example, could lead to a detection of the actuator 1 when it has not correctly been inserted into the switch head 20. Since the inductor 36 is inserted crosswise to the main field direction and above the side lobe of the reading inductor 38, the switch-off distance and the so-called "assured switch-off distance ($s_{ar}$)" are especially close to one another in this defect case as well, because mainly the vertically oriented main lobe of the field is enlarged, but shielded by the hood 42, when there is a defect-related field amplification, for instance.

The end of the first sheet metal part 26 of the actuator 1 turned towards the switch head 20 projects beyond the second sheet metal part 28 with a locking-flank section 44 (FIG. 3) and has an elongated hole 46 through which the lock element 24 can pass and thereby lock the actuator 1 on the switch element 16 in the position shown in FIG. 4. The inductor 36 is arranged on a circuit board 48 that, for its part, likewise has an elongated hole for the lock element 34 to pass through that is larger than the elongated hole 46 in the first sheet metal part 26. The elongated hole 46 of the sheet metal part 26 or the casing 30 in this area forms a locking flank 50 for the lock element 24.

The reading inductor 38 is arranged in the switch head 20 on a coil holder 52 having a circuit board and a winding reel that can likewise extend in a ring around the lock element 24 like the reading inductor 38. A socket element 54 that is preferably made of a ferromagnetic material and that has a sleeve-shaped section for guiding or holding the lock element 24, which can be moved in its longitudinal direction, is arranged between the reading inductor 38 and the lock element 24. A wiper element 56, in particular with an elastically deformable, ring-shaped wiping lip, that is inserted into the front end of the socket element 54 makes contact with the lock element 24 close to its end turned towards the actuator 1. The lock element 24 is coupled in a moving fashion to a carrier 58 at its end opposite the actuator 1; the end of the carrier opposite the lock element 24 is in turn coupled in a moving fashion to an armature tappet 60 projecting further into the switch housing 18.

The switch element 16 has a seal element that is preferably rotationally symmetric to seal the switch housing 18 in the direction of the switch head 20. A radially external first seal section 61 of the seal element is clamped in a sealing fashion between a preferably ring-shaped and/or flat face of the socket element 54 and a sealing edge of the switch housing 18 whose cross-section preferably tapers in a cone shape. A radially internal second seal section 63 of the seal element is clamped in a sealing fashion between a preferably ring-shaped and/or flat face of the socket element 54 and a preferably ring-shaped shoulder surface of a tapered section of the carrier 58. The two seal sections 61, 63 are connected with one another via a one-piece, meandering membrane 62 that serves, on the one hand, as a seal for the switch housing 18 and has, on the other hand, sufficient longitudinal mobility with regard to the travel of the carrier 58.

A stator 64 of a lifting magnet that interacts with an armature element 66 coupled in a movable fashion to the armature tappet 60 is arranged in the switch housing 18 in the area of the armature tappet 60. The stator 64 can, as an example, constitute the coil of an electromagnet; when current is applied to the coil, the armature element 66 and therefore the armature tappet 60, the carrier 58 and the lock element 24 are moved into the switch housing 18 and the lock of actuator 1 is thereby released. A spring element (not shown) for overtravel of the armature element 66 can be arranged in a first hollow cylindrical open space 68 between the armature tappet 60 and the armature element 66. A spring element to provide initial spring tension for the armature element 66 in the direction of the switch head 20 can be arranged in a second hollow cylindrical open space 70 between the armature tappet 60 and the armature element 66.

The end of the armature tappet 60 opposite the switch head 20, in particular a switching flag 72 arranged on its end, projects out of the stator 64. This lower end of the armature tappet 60 can, in accordance with its position, interact with two position sensors 74, 76 arranged one in back of the other; the axial position of the armature tappet 60 and consequently of the lock element 24 can be detected in that way. The two position sensors 74, 76 each involve a light barrier in the example.

Figure 5:
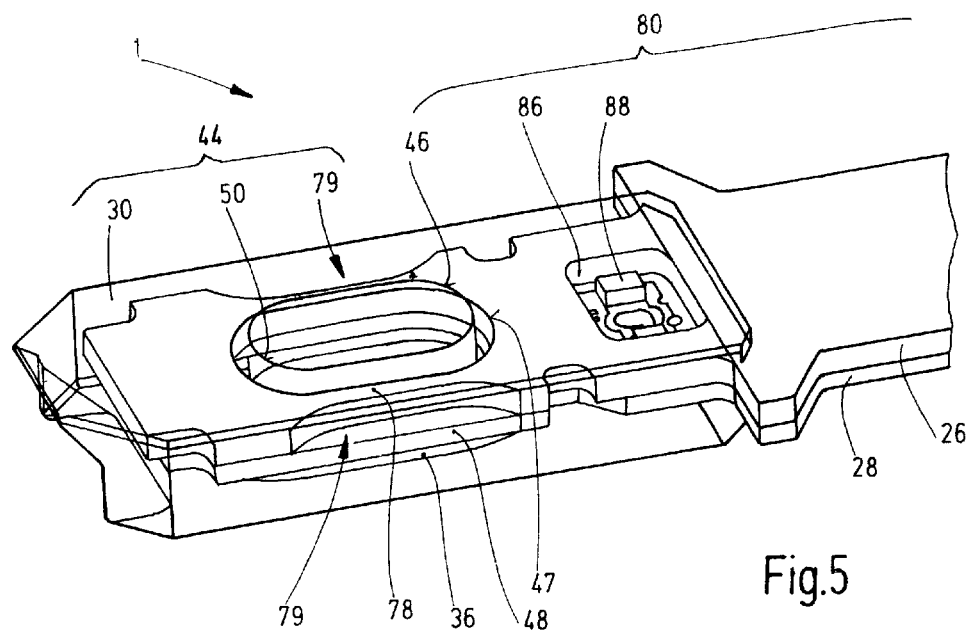
FIG. 5 shows a view in perspective from the top of the actuator.
Figure 6:
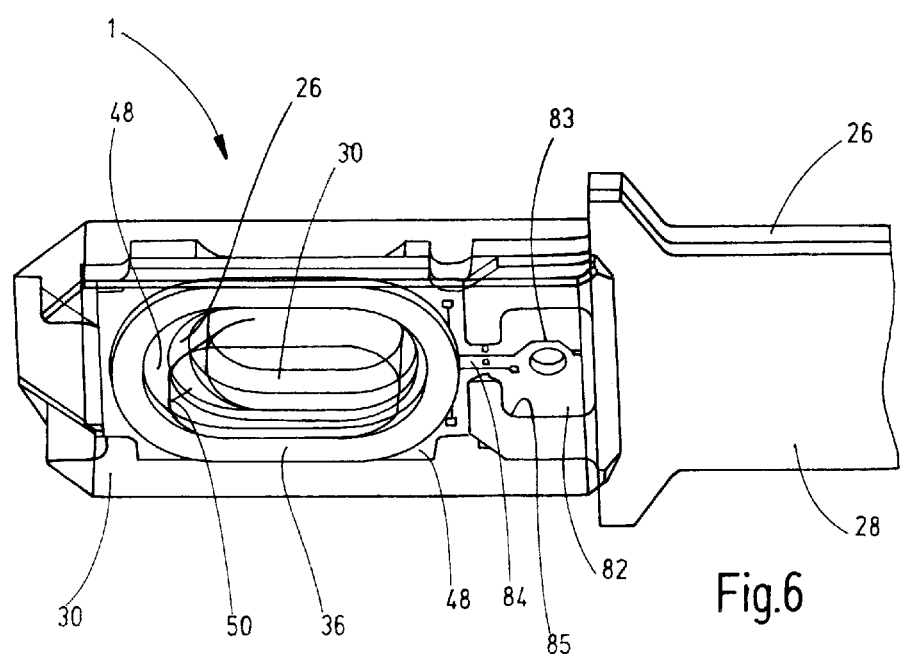
FIG. 6 shows a view in perspective from the bottom of the actuator.

FIG. 5 shows a view in perspective from the top of the actuator 1, and FIG. 6 shows a view in perspective from the bottom of the actuator 1, in particular of its locking-flank section 44 assigned in each case to the switch head 20. The first, in particular strip-shaped sheet metal part 26 has a predetermined breaking point 79 in the area of its oblong elongated hole 46, whose contour is formed by the casing 30 shown in a transparent fashion in FIGS. 5 and 6 and by a thinning of the two legs 78 that border the associated and somewhat larger elongated hole 47 in the first sheet metal part 26. The locking-flank section 44 having the locking flank 50 can be separated from the fastener section 80 of the actuator 1 at the predetermined breaking point 79 when excess tensile force arises in the locked state of the actuator 1. The legs 78 are narrowed for this towards the outside over a length that is more than 50% of the length of the elongated hole 47.

The mechanical predetermined breaking point 79 of the first sheet metal part 26 is specifically designed to ensure that the actuator 1 breaks at a defined place. A recess 86 arranged in the first sheet metal part 26, into which a component 88 required for the contact-free signal exchange of the actuator 1 with the switch element 16 and its reading inductor 38 projects, ensures that the component 88, which could involve a transponder chip or a tuning capacitor, as an example, is pulled out of the switch head 20 when there is an overload of the actuator 1 with the fastener section 80, whereupon the contact-free connection between the actuator 1 and the switch element 16 is interrupted and the safety switch 10 supplies a corresponding output signal.

As an alternative or supplement, the force threshold at which the first sheet metal part 26 breaks at the predetermined breaking point 79 is set in such a way that the switch head 20 and also the switch element 16 remain, despite the break of the actuator 1, undamaged and, in particular, fully functional and capable of further use. Only the actuator 1 has to therefore be replaced when there is an overload of that type, but not the switch element 16.

The overall height of the component 88 and the associated circuit board 48 is greater than the vertical play of the actuator 1 in the switch head 20, so even when the casing 30 gapes open, the component 88 cannot slip under the recess 86, but is instead separated by a positive interlock from the circuit board 48, which leads to an immediate interruption of the safety signal.

The circuit board 48 with the inductor 36 attached on it is arranged on the bottom of the first sheet metal part 26, at or near its end turned towards the switch head 20, preferably in the area of the predetermined breaking point 79. The circuit board 48 and the inductor 36 each have a preferably oblong opening for the passage of the lock element 24. The circuit board 48 has an armature section 82 (FIG. 6) that is connected to the holder area for the inductor 36 via a tapered section 84. At least one connection line 83 of the inductor 36 is routed into the armature section 82. The armature section 82 is coupled via a positive interlock with the fastener section 80 of the actuator 1 here because the armature section 82 is inserted into a recess 85 of the second sheet metal part 28 with an undercut. When there is a mechanical overload of the actuator 1 from excess tensile force in the locked state, this leads to a situation in which the connection line 83 of the coil 36 is interrupted due to a break in the armature section 82 when there is stretching of the predetermined breaking point 79 formed by the legs 78 even before a fracture of the actuator 1. This leads to the safety signal being interrupted first when there is an overload, while the mechanical block remains in effect. The mechanical predetermined breaking point 79 of the actuator 1 only tears when there is an even higher overload.

The first sheet metal part 26 is in the direct flow of force from the lock element 24 to the attachment of the actuator 1 and therefore takes on the majority of the blocking force, and it is equipped with the predetermined breaking point 79. The second sheet metal part 28 is connected via a positive interlock with the transponder circuit board 82, which is equipped via the tapered section 84 with a further predetermined breaking point that can only take on a small amount of force. When there is an overload of the block, the predetermined breaking point 79 of the first sheet metal part stretches, including the plastic area of up to several mm in the example, while the predetermined breaking point on the transponder circuit board 48 severs.

Figures 7, 8:
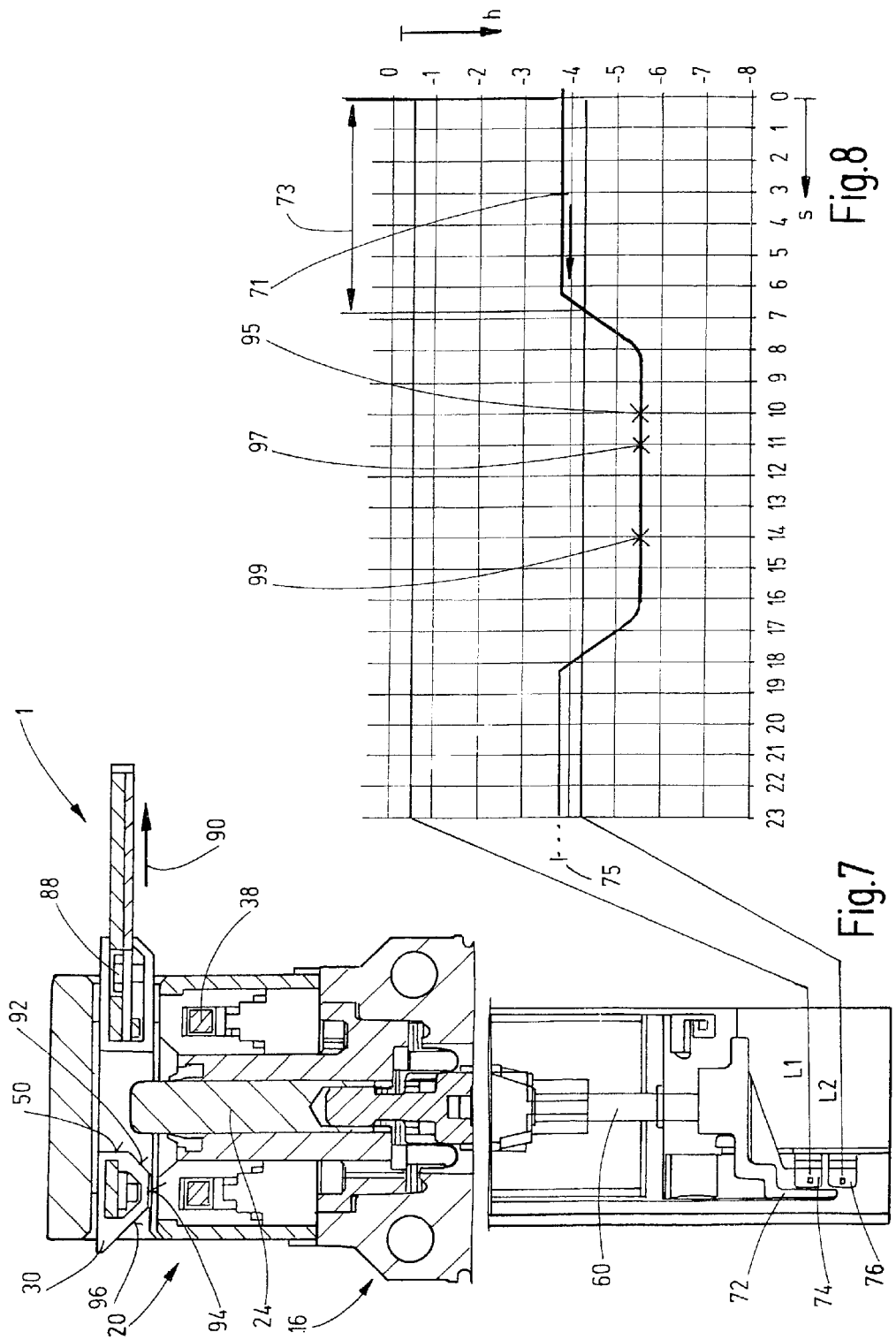
FIG. 7 shows the upper and lower areas of the switch element with an inactive lock or block.
FIG. 8 shows the associated switch path diagram.

FIG. 7 shows in a sectional view the upper area of the switch element 16 with the switch head 20 and a view of the lower area of the switch element 16 with the actuator 1 inserted into the switch head 20, but an inactive lock or block. FIG. 8 shows the associated switch path diagram, namely the stroke h in mm of the lock element 24 or blocking bolt in dependence upon the travel path s in mm of the actuator 1 in the direction of the arrow 90 starting from the starting position 71 shown in FIG. 7. The position s=0 of the actuator 1 corresponds to an actuator 1 inserted all the way into the switch head 20.

In the position shown in FIG. 7, the lock element 24 does in fact project a bit out into the passage opening of the actuator 1, but it does not lock the actuator 1 in place. Accordingly, the lock element 24 is not pushed by the maximum amount into the switch head 20. The light path L2 for a second light barrier forming the second position sensor 76 is therefore released by the switching flag 72. Accordingly, the safety switch 10 in section 73 of the travel path s can signal that, as an example, the protective door that the actuator 1 is fastened to is closed and ready for blocking, but the closed state of the protective door has not yet been blocked (blocking is inactive).

Now when the actuator 1 is pulled out of the switch head 20 in the direction of the arrow 90, a slanted piece 92 adjacent to the locking flank 50 that is essentially at a right angle to the direction of motion 90 of the actuator 1 comes into contact with the lock element 24 and moves the lock element 24 into the switch housing 18. The light path L2 is interrupted in the course of this movement phase.

A section of the switch path diagram in which the lock element 24 makes contact with the face 94 of the actuator 1 and in which a switch-on point 95 is first reached, at which the safety switch 10 signals the presence of the actuator 1 for the first time when the actuator 1 is inserted into the switch head 20, follows that. After that, a switch-off point 97 is reached; when it is reached, the safety switch 10 signals that an actuator 1 is not inserted. The switch-on point 95 and the switch-off point 97 have to be spaced far enough apart to avoid an undesired quick change of the output signal of the safety switch 1 due to slight movements of the actuator 1.

The switching point 99 of the assured switch-off distance ($s_{ar}$), at which an assured shutoff of the safety switch 10 is absolutely ensured even when there is erroneous field amplification and accordingly an enlarged response range 40 of the reading inductor 38, for instance, is reached when the actuator 1 is pulled out further, even while the lock element 24 is in contact with the face 94.

When the actuator 1 is further removed from the switch head 20, the lock element 24 comes into contact with the lead-in chamfer 96 of the casing 30 and therefore moves into the switch head 24 because of initial spring tension, for example. In the process, the light path L2 is released at first by the switching flag 72 and, in further progression, the light path L1 of a first light barrier forming the first position sensor 76 is also released.

When the actuator 1 has been completely moved out of the switch head 20, the lock element 24 reaches its end position 75 marked in the switch path diagram. The contour of the actuator 1 turned towards the lock element 24, which is formed in particular by the covering 30, mirrors the progression of the travel path s in the switch path diagram.

FIG. 9 shows the upper area of the switch element 16 in a sectional view and a view of the lower area of the switch element 16 with an actuator 1 that has not yet been completely inserted into the reading head 24. FIG. 10 shows the associated switch path diagram, namely the stroke h in mm of the lock element 24 or blocking bolt in dependence upon the travel path s in mm of the actuator 1 in the direction of the arrow 98 starting from the starting position 77 shown in FIG. 9.

The lock element 24 just barely comes into contact with the first lead-in chamfer 96 formed by the casing 30 in the position shown in FIG. 9. When the actuator 1 is further inserted, the lock element 24 is moved into the switch element 16, causing the light path L1 of the first light barrier forming the first position sensor 74 to be interrupted at first and, after that, the light path L2 of the second light barrier 76 forming the second position sensor 76 is also interrupted. The lock element 24 is in contact with the face 94 of the actuator 1 after that. In the course of the further insertion of the actuator 1, the inductor 36 of the actuator 1 comes into the response range 40 (FIG. 3) of the reading inductor 38; a switch-off point 97 in the switch path diagram of FIG. 10 is reached at first and, after that, the switch-on point 95 is reached. The actuator 1 is detected by the reading coil 38 of the safety switch 10 starting at this point. The safety switch 10 logically links the detection of the actuator 1 to the signal of at least one of the two position sensors 74, 76 and issues a corresponding output signal if necessary.

When the actuator 1 is further inserted, the lock element 24 comes into contact with the slanted piece 92 and accordingly moves a bit again into the switch head 20. The switching flag 72 releases the light path L2 of the second light barrier in the course of this movement. The safety switch 1 signals that it is ready for a blocking or locking of the actuator 1 starting at this point in time and in the further path section 73.

When the actuator 1 is inserted further, the lock element 24 completely enters the elongated hole 46 of the actuator 1 formed by the casing 30 when there is active blocking, for instance due to current being applied to the stator 64 or due to initial spring tension, and completely moves into the switch head 20, so the first light barrier also releases the light path L1. Accordingly, the safety switch 10 in the path section 81 signals that the actuator 1 has been completely inserted in a satisfactory way and is also locked; consequently, the safety device of the machine 4, for instance, is locked and blocked and is therefore in a safe state. Now if a tensile force is exerted on the actuator 1, the locking flank 50 makes contact with the lock element 24 that forms a positive interlock and that therefore blocks the actuator 1 and locks the switch element 16.

The invention claimed is:

1. Actuator (1) of a safety switch (10) for detecting and locking a specifiable state of an apparatus (2), wherein the actuator (1) has an inductor (36) for a contact-free signal exchange with a reading inductor (38) of a switch element (16) of the safety switch (10), and wherein the actuator (1) has a locking flank (50) on which a lock element (24) of the switch element (16) can be brought into locking contact and the actuator (1) can therefore be locked on the switch element (16), characterized in that the inductor (36) has at least one winding extending around the locking flank (50) or around a recess or hole in the actuator (1) forming the locking flank (50) so that the at least one winding extends around the lock element (24) or around an extension of the lock element (24) in the state in which the actuator (1) is locked to the switch element (16), wherein a recess or hole forming the locking flank (50) is centrally arranged within the at least one winding of the inductor (36) and wherein the actuator (1) has a predetermined breaking point (79) that is arranged between a fastener section (80) and a locking-flank section (44) of the actuator (1) having the locking flank (50) and that the locking-flank section (44) can be separated from the fastener section (80) at the predetermined breaking point (79) when excess tensile force arises in the state of the actuator (1) in which it is locked to the switch element (16).

2. Actuator (1) according to claim 1, characterized in that a first portion of the electrical components of the actuator (1) required for the signal exchange with the switch element (16) are connected to the locking-flank section (44) and a second portion of the electrical components of the actuator (1) required for the signal exchange with the switch element (16) are connected to the fastener section (80) and that an electrical connection of the two portions of the electrical components required for the signal exchange with the switch element (16) can be separated, and the signal exchange will therefore be interrupted, when excess tensile force arises.

3. Actuator (1) according to claim 2, characterized in that the predetermined breaking point (79) can be stretched before the separation of the locking-flank section (44) from the fastener section (80) and that the electrical connection of the two portions of electrical components required for the signal exchange with the safety switch can be separated as long as the locking-flank section (44) has not yet been separated from the fastener section (80).

4. Actuator (1) according to claim 1, characterized in that a circuit board (48) having at least a portion of the electrical components of the actuator (1) required for the signal exchange with the switch element (16) has an armature section (82) that is coupled in a movable fashion to the fastener section (80) of the actuator (1) via a positive interlock.

5. Actuator (1) according to claim 1, characterized in that the actuator (1) has at least two sheet metal parts one on top of the other, wherein a first sheet metal part (26) forms the locking-flank section (44) having the locking flank (50) and a second sheet metal part (28) is positioned further back with respect to one end of the first sheet metal part (26) forming the locking-flank section (44).

* * * * *